United States Patent [19]

Beyer et al.

[11] Patent Number: 5,192,708
[45] Date of Patent: Mar. 9, 1993

[54] SUB-LAYER CONTACT TECHNIQUE USING IN SITU DOPED AMORPHOUS SILICON AND SOLID PHASE RECRYSTALLIZATION

[75] Inventors: Klaus Beyer, Poughkeepsi, N.Y.; Edward C. Fredericks, Manassas, Va.; Louis L. Hsu, Fishkill, N.Y.; David E. Kotecki, Hopewell Junction, N.Y.; Christopher C. Parks, Beacon, N.Y.

[73] Assignee: International Business Machines Corporation, Armonk, N.Y.

[21] Appl. No.: 693,979

[22] Filed: Apr. 29, 1991

[51] Int. Cl.⁵ .......................................... H01L 21/20
[52] U.S. Cl. ..................... 437/90; 437/101; 437/203; 437/233; 437/247; 437/967; 148/DIG. 50
[58] Field of Search ............ 437/90, 82, 101, 203, 437/233, 247, DIG. 967, 67, 68; 148/DIG. 3, DIG. 25, DIG. 122, DIG. 50

[56] References Cited

U.S. PATENT DOCUMENTS

| | | | |
|---|---|---|---|
| 3,617,826 | 11/1971 | Kobayashi | 317/235 R |
| 3,730,765 | 5/1973 | Stein | 117/212 |
| 4,252,579 | 2/1981 | Ho et al. | 148/174 |
| 4,358,326 | 11/1982 | Doo | 148/174 |
| 4,546,538 | 10/1985 | Suzuki | 29/576 W |
| 4,554,728 | 11/1985 | Shepard | 29/576 W |
| 4,814,292 | 3/1989 | Sasaki et al. | 437/101 |
| 4,877,753 | 10/1989 | Freeman | 437/101 |
| 4,924,284 | 5/1990 | Beyer et al. | 357/49 |
| 4,931,409 | 6/1990 | Nakajima et al. | 437/63 |

FOREIGN PATENT DOCUMENTS

| | | | |
|---|---|---|---|
| 390607 | 10/1990 | European Pat. Off. | 437/101 |
| 58-96751 | 6/1983 | Japan . | |
| 2262333 | 10/1990 | Japan | 437/101 |

OTHER PUBLICATIONS

Wolf, S., *Silicon Processing for the VLSI Era,*, vol. 1, ©1986, pp. 177-180.
Wolf, S., *Silicon Processing for the VLSI Era*, vol. 2, ©1990, p. 253.
IBM TDB article, entitled "Growing Crack-Free Single-Crystal Films" by Chadhari et al., vol. 15, No. 9, Feb. 1973.
MES Symposium Proceedings, entitled "Formation of SI on Insulator Structure by Lateral Solid ... " 1987.

*Primary Examiner*—Olik Chadhuri
*Assistant Examiner*—G. Fourson
*Attorney, Agent, or Firm*—Jeffrey S. LaBaw

[57] ABSTRACT

A method of providing sublayer contacts in vertical walled trenches is proposed. In accordance with the present invention, the phosphorus doped amorphous silicon is deposited at temperatures less than 570° C. The conversion into the extremely large crystal low resistivity polysilicon is accomplished by a low temperature anneal at 400° C. to 500° C. for several hours and a short rapid thermal anneal (RTA) treatment at a high temperature approximately 850° C. for twenty seconds. These two conversion heat treatments are done at sufficiently low thermal budget to prevent any significant dopant movement within a shallow junction transistor. After anneal, the excess low resistivity silicon is planarized away by known techniques such as chemical/mechanical polishing. In addition, due to the trench filling abilities of the amorphous silicon CVD process, in one preferred embodiment of the invention the capability of accessing subsurface silcon layers at different trench depths is demonstrated.

12 Claims, 3 Drawing Sheets

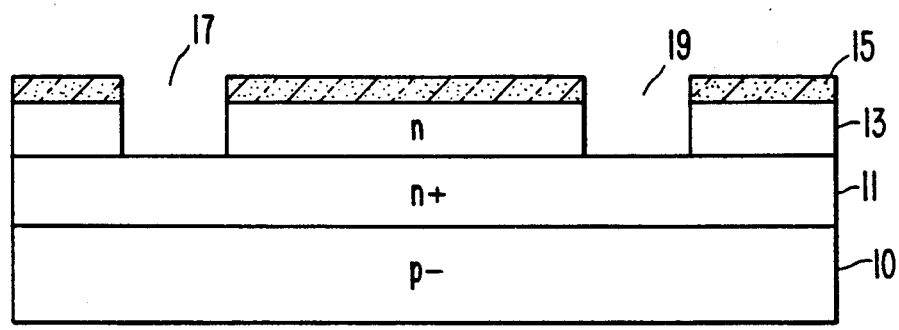
FIG. IA
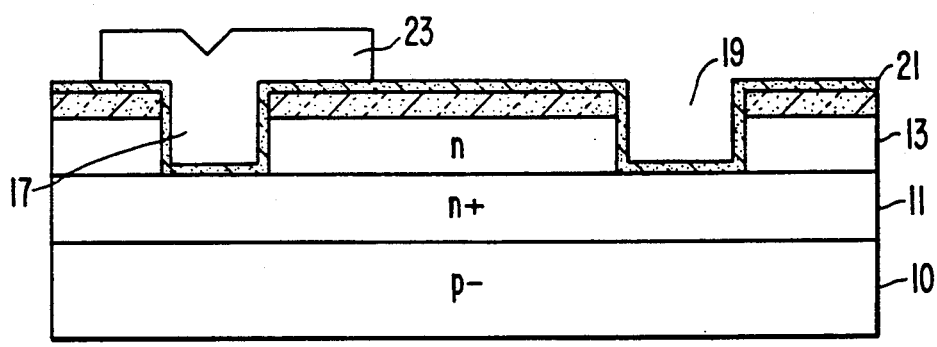
FIG. IB
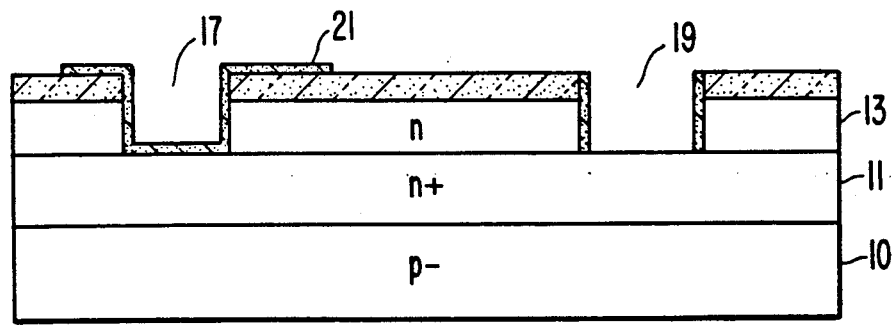
FIG. IC
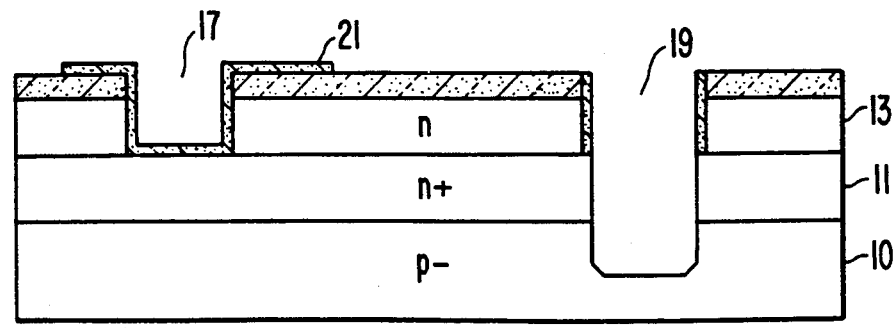
FIG. ID

SUB-LAYER CONTACT TECHNIQUE USING IN SITU DOPED AMORPHOUS SILICON AND SOLID PHASE RECRYSTALLIZATION

BACKGROUND OF THE INVENTION

This invention relates generally to the fabrication of semiconductor integrated circuits. More particularly, it relates to a method of filling deep and shallow trenches with an amorphous silicon through chemical vapor deposition and converting the amorphous silicon to large grain, nearly single crystalline silicon for fabrication of low resistivity contacts.

With ever increasing demand for smaller and smaller integrated semiconductor circuits, many of the features of the circuits have been fabricated with narrow trenches with vertical sidewalls to overcome the disadvantages of isolation by recessed oxidation or diffusion isolation. It has become well known in the art to provide trenches in the silicon substrate to overcome the disadvantages of the thermal oxidation. This technique typically uses a reactive ion etching (RIE) process capable of etching a silicon substrate vertically to form deep grooves of a given width having nearly vertical sidewalls. These trenches can then be filled with a variety of dielectric materials including glasses, oxides or silicon nitride. These materials however, have a tendency to leave voids inside the trench, particularly when the aspect ratio of the trench increases, i.e. the trench is relatively deep.

It is also known to use undoped chemical vapor deposited (CVD) polysilicon to fill isolation trenches. Unlike deposited glasses and oxides, CVD polysilicon tends to fill trenches with aspect ratios in the range of 4:1-5:1 easily without leaving voids inside the trench. The undoped polysilicon also has an advantage of having thermal match of the expansion coefficient with a silicon substrate.

Other features such as sublayer contacts including substrate, well and subcollector contacts can be formed in narrow trenches. One known process which provides a substrate contact using a CVD polysilicon or epitaxial silicon trench fill process is disclosed in commonly assigned U.S. Pat. No. 4,924,284, to Beyer et al. In this process, the trenches in which the substrate contacts are formed are selectively doped, either by boron diffusion from a borosilicate sidewall into the polysilicon trench fill or by an in-situ boron doped epitaxial layer. Those trenches which are used as isolation regions are not doped. It requires a high temperature (>900° C.) to grow epitaxial silicon. Also, surface faceting and sidewalls defect formation present problems for the above process.

While the polysilicon processes described in the U.S. Pat. No. 4,924,284 possess certain advantages for trench fill formation of sublayer contacts, they also share some drawbacks.

Most of these drawbacks relate to the granular character of the CVD polysilicon material as it is deposited. On one hand, the grain size of a polysilicon film as deposited via a CVD process is relatively small, on the order of 100 Angstroms. While a thermal anneal process can increase the grain size somewhat, it is difficult to attain the low resistivity desired in a sublayer contact because of the presence of the grain boundaries. Additional dopant becomes inactive at the grain boundaries, and thus the overall sheet resistance is gated by the grain size. On the other hand, while a larger grain size of the polysilicon is desirable for improved conductivity, the grain size limits the ability of the CVD process to provide a good trench fill. Larger grain sizes will only make this effect worse. At a 100 Angstrom grain size, the granular character of the CVD polysilicon negatively impacts the filling of trenches with aspect ratios higher than 4:1 to 5:1.

Another disadvantage with a CVD polysilicon process is that the process temperatures in the deposition process are relatively high. A typical CVD polysilicon process in the art requires temperatures in the range of 628° C. for deposition. The high temperature anneal which follows is in the range of 850° C. In general, lower temperature processes are desired to decrease the effects of thermal cycling on the substrate and control dopant diffusion.

SUMMARY OF THE INVENTION

It is therefore an object of the present invention to fill high aspect ratio trenches for sublayer contacts in a relatively low temperature process.

It is another object of the invention to choose a trench filling material with a minimum grain size which will be well matched thermally to the silicon substrate.

It is a further object of the invention to provide low resistivity sublayer contacts in a simple, low-temperature fabrication process.

These objects and others are accomplished by a relatively low temperature CVD doped amorphous silicon deposited, which is converted into a nearly single crystalline silicon upon a low temperature anneal and a subsequent, short Rapid Thermal Anneal (RTA) treatment at high temperature.

In accordance with the present invention, the in-situ doped amorphous silicon is deposited into deep narrow trenches at temperatures less than 570° C. The conversion into the extremely large crystal low resistivity polysilicon is accomplished by a low temperature anneal at 400° C. to 500° C. for several hours and the short RTA treatment at a high temperature approximately 850° C. for twenty seconds. These two conversion heat treatments are done at sufficiently low thermal budget to prevent any significant dopant movement within a shallow junction transistor. After anneal, the excess low resistivity silicon outside the trenches is planarized away by known techniques such as chemical/mechanical polishing or reactive ion etchback.

In addition, the trench filling abilities of the amorphous silicon CVD process are demonstrated in one preferred embodiment of the invention, showing the capability of accessing subsurface silicon layers at different trench depths. In particular, a monocrystalline semiconductor substrate is provided having a pattern of substantially vertical walled trenches, some of which are etched to the depth of the subcollector and some of which are etched further to the depth of the silicon substrate. Thus, with a single deposition both subcollector and silicon substrate contacts are formed at their respective depths in the silicon subsurface layers.

This invention is discussed in greater detail by reference to the attached drawings as follows.

BRIEF DESCRIPTION OF THE DRAWINGS

FIGS. 1A-1H are cross sectional views of the representative portion of a semiconductor device having subcollector and substrate contacts as it is fabricated according to the process of the present invention.

DETAILED DESCRIPTION OF THE DRAWINGS

Figure 1E:
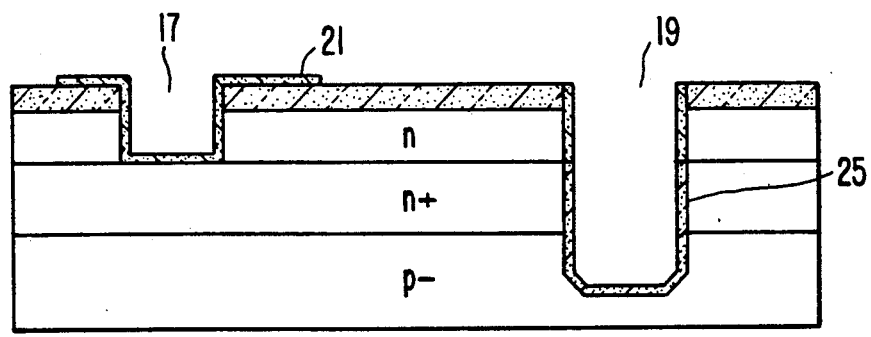

Referring to FIG. 1A, a P− wafer 10 is ion implanted with arsenic to form an N+ region after drive-in heat treatment. Subsequently, silicon is epitaxially grown to form the extended N+ layer 11 and the N− layer 13. Then, several dielectric layers 15 preferably consisting of thermal oxide, CVD silicon nitride and CVD TEOS $SiO_2$ are deposited to serve as the trench mask layer 15. After conventional photoresist coating and the patterning of the photoresist (not shown), the dielectric layers are etched in a $CF_4$ containing plasma. Other suitable masking layers and etching plasmas would be well known to the art. After the photoresist is removed by a plasma asher in $O_2$, the wafer is etched in a $Cl_2$ containing plasma to a depth that reaches or slightly exceeds the N+ region 11 to form the openings 17 and 19, as shown in FIG. 1A.

In the next step, as shown in FIG. 1B, the opening 17 which will become the subcollector contact is masked off. One suitable method is to deposit a layer of CVD silicon dioxide 21 on the order of 150 nm to conformally cover the etched structure. The wafer is coated again with photoresist which is patterned using a block-out mask to protect the subcollector contact region 17 to form a photoresist mask 23.

The resulting structure is shown in FIG. 1B. The photoresist mask 23 protects the subcollector region 17 when reactive ion etching (RIE) is used to etch the CVD $SiO_2$ 21 in $CF_4$ outside the photoresist mask 23 to produce a silicon dioxide sidewall in the opening 19, which corresponds to the substrate contact. Then, the photoresist mask 23 is stripped in an asher in $O_2$. The resulting structure is shown in FIG. 1C.

As shown in FIG. 1D, a $Cl_2$ containing plasma is used to etch the N+ layer 11 and a small amount of the P− substrate 10 in the opening 19, while the subcollector contact area 17 is protected by a CVD $SiO_2$ layer 21. As shown in FIG. 1E, the silicon exposed on the trench sidewall in opening 19 is oxidized slightly to form a 100 nm thin thermal oxide layer 25. Thus, trenches to the subcollector and substrate layers are provided. Those skilled in the art would appreciate that other well known processes of etching vertical trenches in silicon substrates could be used.

Figure 1F:
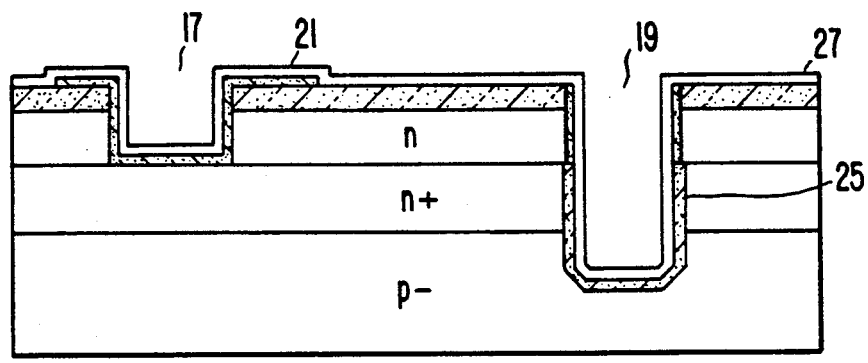
Figure 1G:
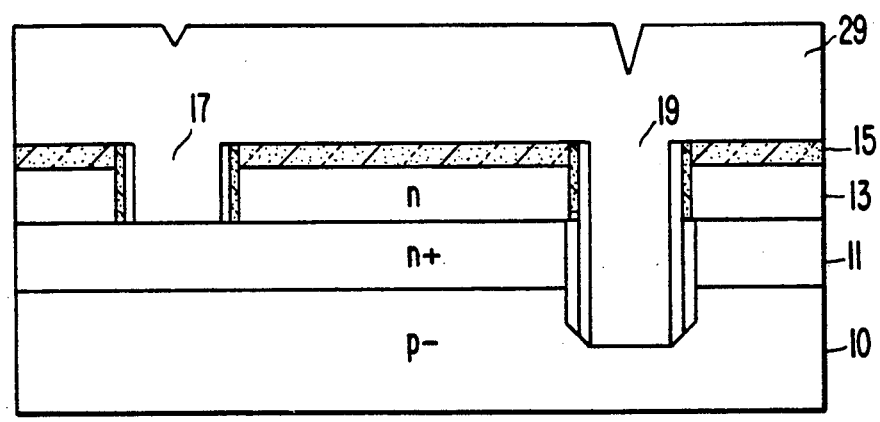

As depicted in FIG. 1F, a CVD oxide layer 27 of approximately 100 nm in thickness is deposited on the whole structure. Next as shown in FIG. 1G, a reactive ion etch process is applied to etch the CVD oxide layer 27 at the bottom of both trenches 17 and 19, and the thermally grown oxide 25 at the bottom of the substrate contact trench 19 and the CVD oxide layer 21 used as the original masking layer at the bottom of the subcollector contact trench 17. This etch step is used to expose the silicon surface at the bottom of both contact trench areas 17 and 19. Native oxide on the bottom of the contact areas 17 and 19 is removed in a buffered hydrofluoric acid (BHF) solution just prior to amorphous silicon deposition.

Next, as illustrated in FIG. 1G, the most significant part of the invention, the wafers are loaded into a CVD system, preferably in a vacuum, to deposit in-situ boron, arsenic or phosphorus doped CVD amorphous silicon 29 at a thickness on the order of 1.5 um. This thickness of amorphous silicon will effectively fill trenches on the order of 4-7 um deep and 1-2.5 um wide. The typical deposition conditions are: temperature in the range of 500° to 570° C., pressure in the range of 0.2 to 2.0 Torr, 0.5 to 5% of dopant in $SiH_4$ with gas flow rate about 100 sccm. Suitable dopant source gases include $PH_3$, $AsH_3$, or $B_2H_6$. Other silicon containing source gases such as disilane may be used. In the next step, the amorphous silicon film 29 is densified at 450° C. for 1 hour in the same CVD system. Densification refers to a method of increasing the film density, decreasing the thickness of the film very slightly. Immediately after deposition, the amorphous silicon film contains a high proportion of $H_2$ atoms. During densification, the $H_2$ is driven out of the film and the silicon atoms begin to pack more densely together. The densification process in the CVD system should be performed immediately after deposition to minimize the chance of $O_2$ diffusion into the porous X-Si film. $O_2$ diffusion would adversely affect the conductivity of the final recrystallized silicon material.

After the removal of the wafers from the chemical vapor deposition system, the wafers are placed in a furnace to subject the wafers to a forming gas or vacuum anneal between 450° and 480° C. for few hours, for example, 5 hours, to start or to continue the crystallization process of the amorphous silicon film. The bare silicon surfaces at the bottom of contact areas 17 and 19 provide seeding regions from which the nearly single crystal lattice structure of the trench fill is initiated. In the final heat treatment step, the wafers receive a rapid thermal anneal (RTA) in forming gas or vacuum at 850° C. for 20 seconds to completely activate the dopants in the now nearly single crystalline silicon 29 to obtain the low resistivity silicon contact material. Forming gas, a mixture of nitrogen and hydrogen, is typically used for annealing. Other nonoxidizing gases such as Ar and $N_2$ can also be used during the anneal step, but gases such as oxygen and air will oxidize the silicon film and increase resistivity and should be avoided.

Figure 1H:
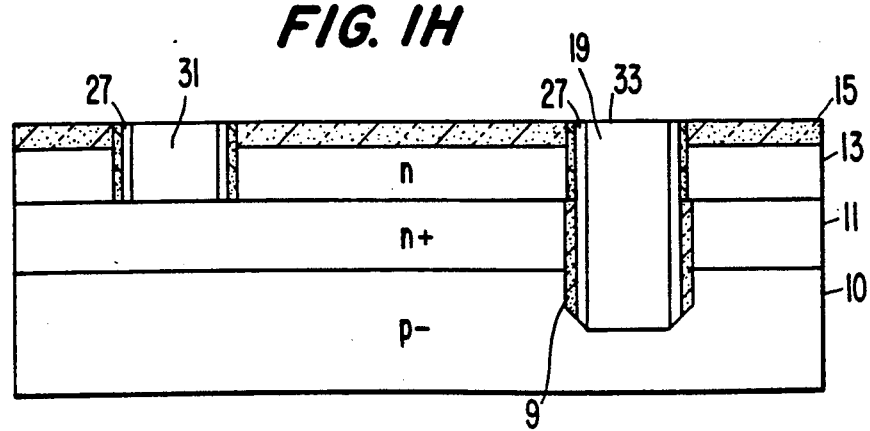

At the completion of the process as shown in FIG. 1H, the wafers coated with low resistivity polysilicon are subjected to known chemical-mechanical polishing techniques to achieve the planarized structure with the subcollector contact 31 and the substrate contact 33. The planar dielectric layer stack 15 acts as a polishing stop layer. Alternative planarization processes such as RIE etchback can be used to remove the excess silicon material 29 over the substrate.

In the preferred embodiment above, various dielectric layers and their preferred thicknesses were given. Other dielectric materials may be used, as well as other thicknesses of these layers as within the scope of the invention.

The chemical vapor deposition method of filling trenches with amorphous silicon has an improved filling capability as the material has no grain structure as it is deposited. Compared to polysilicon, the surface is much smoother. As a trench is filled the interface between the two opposing films on the trench sidewalls will close up perfectly without leaving a void. The process will achieve good trench filling of an 8:1 aspect ratio. This is significantly better than can be achieved using a CVD polysilicon trench fill process.

Figure 2:
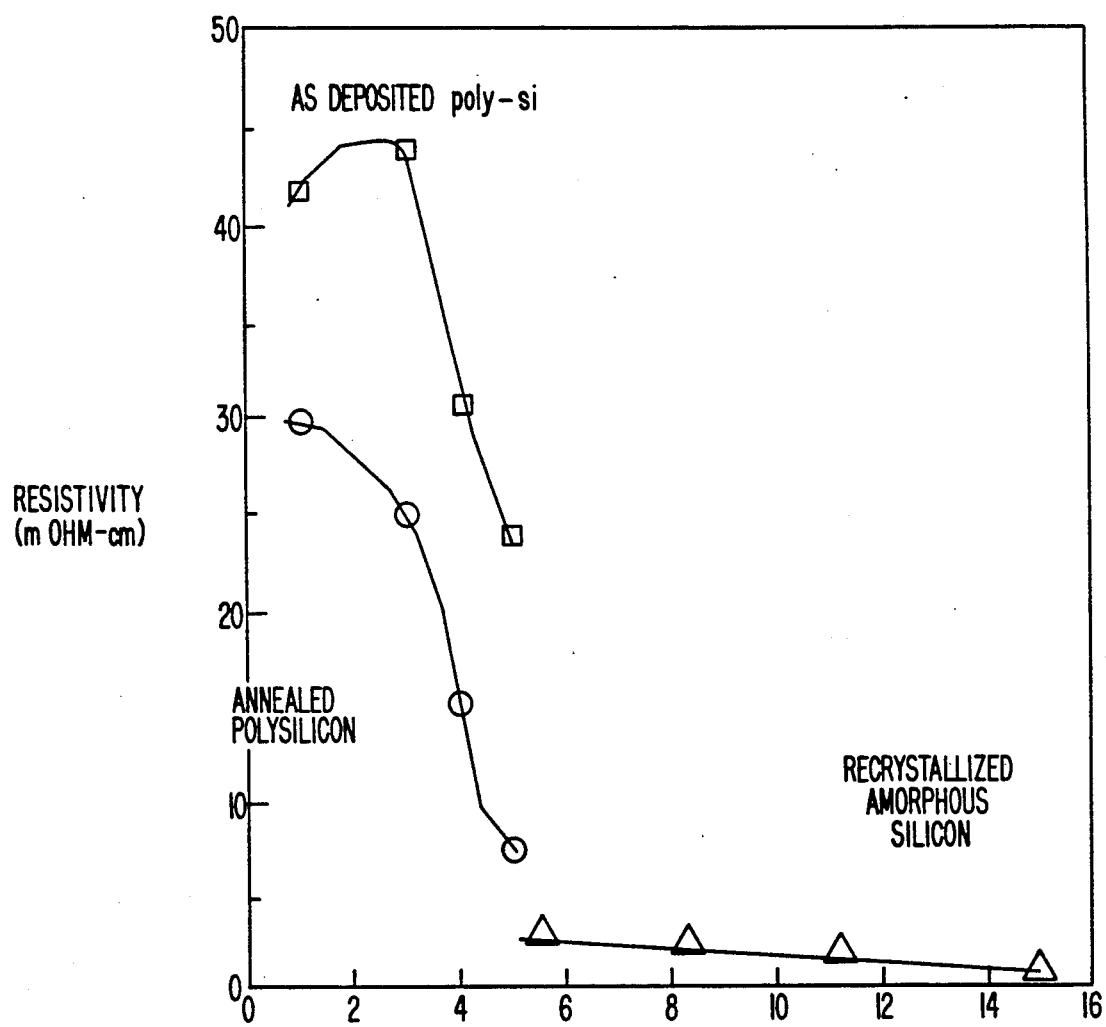
FIG. 2 shows the resistivity of the recrystallized amorphous silicon of the present invention compared to resistivity of prior art doped polysilicon.

The amorphous silicon can be converted into a much lower resistivity silicon material than the conventionally doped polysilicon CVD process. Larger grain size, and thus higher conductivity is achieved by a combination of the low temperature crystallization and the use of high dopant concentration in the CVD deposition gas. It has been found in the process of the present invention, that a high dopant concentration on the order of $10^{20}/CM_3$, enhances the crystallization of the amorphous silicon, producing almost single crystalline material. As there are no grain boundaries in the film, the electronic carriers will flow much more freely through the contact. As shown in FIG. 2, when compared to a conventional polysilicon, a reduction by a factor of 10 in the overall sheet resistance is achieved.

Lower material stress compared to CVD polysilicon is achieved again by the lack of grain boundaries in the crystallized contact material at the interface with the single crystal silicon substrate.

While the invention has been described with reference to a preferred embodiment, it will be understood by those skilled in the art that changes may be made without departing from the spirit and scope of the invention. For example, the embodiment described above includes both subcollector and substrate contacts. Those skilled in the art would understand that other sublayer contacts, such as well contacts for MOSFET, BiCMOS device integration would be included in the scope of the present invention.

We claim:

1. A method of filling at least one trench in a surface of a semiconductor substrate comprising the steps of:
   providing a surface of said semiconductor substrate having at lest one trench having substantially vertical sidewalls extending down from said surface to a sublayer of said semiconductor substrate to a chemical vapor deposition system;
   evacuating and heating said chemical vapor deposition system to a temperature less than 570° C.;
   entering a mixture of silicon containing source gas and a dopant source gas into said chemical vapor deposition system to form a layer of doped amorphous silicon filling said trench;
   annealing said layer of doped amorphous silicon at a temperature less than 500° C. to form a doped large grained polysilicon layer; and,
   activating a dopant in said doped amorphous silicon layer through a short, high temperature anneal.

2. The method as recited in claim 1 which further comprises the step of removing the excess portions of said large grained polysilicon layer through a planarization process.

3. The method as recited in claim 2 wherein said doped, large grained polysilicon in said trench forms a sublayer contact.

4. The method as recited in claim 3 wherein said semiconductor substrate surface has a plurality of trenches at least one of which extends downward to a different sublayer of said semiconductor substrate than a second of said plurality of trenches, and said doped, large grained polysilicon in said trenches form a plurality of different sublayer contacts.

5. The method as recited in claim 4 wherein at least one subcollector contact is formed.

6. The method as recited in claim 1 wherein said dopant source gas is selected from the group consisting of $PH_3$, $A_sH_3$ and $B_2H_6$.

7. The method as recited in claim 1 which further comprises the step of densifying said doped amorphous silicon at an elevated temperature immediately after said entering step.

8. A method of forming a plurality of sublayer contacts in a surface of a semiconductor substrate having a plurality of vertically-walled trenches etched therein and extending to at least one sublayer of said semiconductor substrate comprising the steps of:
   depositing a layer of doped amorphous silicon on said surface filing said plurality of trenches in a chemical vapor deposition system at a temperature less than 570° from a mixture of a silicon containing source gas and a dopant source gas;
   annealing said layer of doped amorphous silicon at a temperature less than 500° C. to form a doped large grained polysilicon layer; and,
   activating a dopant in said doped amorphous silicon layer through a short, high temperature anneal.

9. The method as recited in claim 8 which further comprises the step of densifying said doped amorphous silicon at an elevated temperature immediately after said entering step.

10. The method as recited in claim 8 which further comprises the step of removing the excess portions of said large grained polysilicon layer through a planarization process.

11. The method as recited in claim 10 wherein said doped, large grained polysilicon in said trench forms a sublayer contact.

12. The method as recited in claim 11 wherein said semiconductor substrate surface has a plurality of trenches at least one of which extends downward to a different sublayer of said semiconductor substrate than a second of said plurality of trenches, and said doped, large grained polysilicon in said trenches form a plurality of different sublayer contacts.

* * * * *